(12) United States Patent
Ou

(10) Patent No.: US 8,974,090 B2
(45) Date of Patent: Mar. 10, 2015

(54) HIGH CONTRAST WATER-PROOF LED LAMP

(71) Applicant: Kindwin OPTO Electronic (Shenzhen) Co., Ltd., Shenzhen (CN)

(72) Inventor: Yongchao Ou, Shenzhen (CN)

(73) Assignee: Kindwin OPTO Electronic (Shenzhen) Co., Ltd., Shenzhen, Guangdong (CN)

( * ) Notice: Subject to any disclaimer, the term of this patent is extended or adjusted under 35 U.S.C. 154(b) by 136 days.

(21) Appl. No.: 13/742,055

(22) Filed: Jan. 15, 2013

(65) Prior Publication Data

US 2014/0036508 A1    Feb. 6, 2014

(30) Foreign Application Priority Data

Aug. 2, 2012 (CN) .......................... 2012 1 0272821

(51) Int. Cl.
| F21V 3/00 | (2006.01) |
|---|---|
| F21V 7/00 | (2006.01) |
| F21V 31/00 | (2006.01) |
| H01L 33/48 | (2010.01) |
| H01L 33/60 | (2010.01) |
| H05K 3/28 | (2006.01) |

(52) U.S. Cl.
CPC ................. *F21V 7/00* (2013.01); *F21V 31/005* (2013.01); *H01L 33/486* (2013.01); *H01L 33/60* (2013.01); *H05K 3/28* (2013.01); *H01L 2924/0002* (2013.01); *H05K 2201/10106* (2013.01); *Y10S 362/80* (2013.01)
USPC ................... 362/311.02; 362/217.1; 362/267; 362/800

(58) Field of Classification Search
CPC .......... F21V 31/005; F21V 15/01; F21K 9/52
USPC .............. 362/217.1, 253, 267, 341, 477, 645, 362/800, 311.02; 257/98; 313/512
See application file for complete search history.

*Primary Examiner* — Anh Mai
*Assistant Examiner* — Meghan Dunwiddie
(74) *Attorney, Agent, or Firm* — Tim Tingkang Xia, Esq.; Morris, Manning & Martin, LLP

(57) ABSTRACT

The present invention discloses a high contrast water-proof LED lamp, including: a casing provided with a reflective cup (10), a PCB (12) disposed on the bottom surface of the casing, an LED chip (1) disposed inside the reflective cup (10), and a light-guiding packaging adhesive (4). The casing is composed of a light color layer (8) in the lower part and a dark color layer (9) in the upper part, and a top surface of the PCB (12) and an outer surface of the light color layer (8) of the casing are provided with black water-proof adhesive sealant (11). The lower part of the inner surface of the reflective cup is a light color layer and the upper part is a dark color layer.

3 Claims, 4 Drawing Sheets

HIGH CONTRAST WATER-PROOF LED LAMP

CROSS-REFERENCE TO RELATED APPLICATIONS

This non-provisional application claims priority under 35 U.S.C. §119(a) on Patent Application No. 201210272821.1 filed in P.R. China on Aug. 2, 2012, the entire contents of which are hereby incorporated by reference.

FIELD OF THE INVENTION

The present invention relates to a light-emitting diode (LED) lamp, and in particular, to a high contrast water-proof LED lamp.

BACKGROUND OF THE INVENTION

With rapid popularity of LED lamps, market sales volumes are increasing and the costs are decreasing. This promises a bright future for promotion of display screens with higher contrast and high definition. A conventional LED lamp typically consists of a plastic casing provided with a reflective cup, a package PCB disposed on the back of the plastic casing, where the reflective cup is provided with an LED chip electrically connected to the PCB and a light-guiding packaging adhesive.

To improve the contrast, a traditional LED lamp typically adopts the following solutions:

1. White casing with screen-printed black surface—a black coating 3 is screen-printed on the top surface of a white plastic casing 2, and a chroma contrast is formed between the surface of a white reflective cup 5 and a black coating 3 on the top surface thereof to enhance the contrast displayed by the product; where the reflective cup 5 is provided with an LED chip 1 and a light-guiding packaging adhesive 4, as shown in FIG. 1.

Disadvantage: Since the surroundings of the LED chip 1 and the inner surface of the reflective cup 5 are all white, the surfaces of the white plastics will reflect ambient light so that the contrast displayed by the product is reduced.

2. All-black casing—Black plastic replaces the original white plastic for injection molding of a casing, so that the surfaces of the casing 6 and the reflective cup 5 are black to enhance the contrast displayed by the product, as shown in FIG. 2.

Disadvantage: Since the surface of the reflective cup 5 inside the LED chip 1 is also black, light emitted by the LED chip cannot be better reflected from the surface of the black reflective cup, and luminance of the light emitted by the LED chip is greatly reduced. To solve the problem of the luminance, some manufacturers improve the luminance of the LED lamp by improving the LED current. This, however, goes against an energy-saving concept of the LED lamp, and also increases heat discharge of the product, and affects life of the LED lamp.

3. Outer-black and inner-white casing—Blank plastic is used for injection molding of the casing 6, and a reflective cup's lining 7 made by injection molding using white plastic is used. This makes a uniformly black appearance for the reflective cup from viewpoints of the outer and top portion of the reflective cup's lining. However, the surface of the reflective cup's lining 7 is white. This effectively enhances the contrast but does not reduce luminance of the light emitted by the LED chip, as shown in FIG. 3.

Disadvantage: Ambient light will be reflected from the surface of the reflective cup so that the contrast is reduced. In addition, since a three-layer composition structure is used, the water-proof effect is hard to achieve. Generally, manufacturers only use this structure for products having a lower water-proof requirement, and therefore adaptability is poor.

In view of the above, how to design a water-proof LED lamp with high contrast, low power-consumption and high adaptability is a technical issue to be addressed in the industry.

SUMMARY OF THE INVENTION

To solve the above technical problem, the present invention provides a water-proof LED lamp with high contrast, low power-consumption and high adaptability, where water-proof property is achieved by applying adhesive sealant to the LED lamp.

Typically, water-proofing is implemented for an LED lamp as follows: filling adhesive sealant XS211B or XS211BC on the front surface of the LED lamp, applying conformal coating TF8801—in the circuit board, and performing water-proof treatment for the outer casing. In this way, the modules disposed inside thereof are not affected from moisture.

The high contrast water-proof LED lamp includes: a casing provided with a reflective cup, a printed circuit board (PCB) disposed on the bottom surface of the casing, an LED chip disposed inside the reflective cup, and a light-guiding packaging adhesive. The casing is composed of a light color layer in the lower part and a dark color layer in the upper part, and a top surface of the PCB and an outer surface of the light color layer of the casing are provided with black water-proof adhesive sealant.

The light color layer is a white layer, a light yellow layer, or a light gray layer.

The dark color layer is a black layer, a dark blue layer, a dark gray layer, or a dark coffee layer.

The casing with the reflective cup according to the present invention is formed by a composite of a light color layer in the lower part and a dark color layer in the upper part. Therefore, with regard to the reflective cup's inner surface which depresses downward from the top surface of the casing, the lower part is a light color layer and the upper part is a dark color layer. When the LED chip emits light, the bottom surface of the reflective cup and the surface of the light color layer in the lower part reflect the light. Ambient light can be only lead on the surface of the dark color layer in the upper part of the reflective cup (but the dark color layer does not reflect the light), but are hard to be lead to the surface of the light color layer in the lower part. In this way, the ambient light does not cause interference to luminance of the light emitted by the LED chip, so that the contrast displayed by the product is enhanced. In addition, a top surface of the PCB and an outer surface of the light color layer of the casing are provided with black water-proof adhesive sealant. The adhesive sealant packages the outer surface of the light color layer of the casing to make a uniformly black appearance for the casing from viewpoints of the top surface and surroundings thereof. This, however, just reserves white reflective portions surrounding the LED lamp and in the lower part of the reflective cup, thereby maintaining luminance of the light emitted by the LED chip optimal. Since a joint portion between the upper and lower parts of the casing, an exposed laminated line of the LED chip, and the bottom layer are all fully packaged by the water-proof adhesive sealant, the water-proof effect is ensured.

DETAILED DESCRIPTION OF THE EMBODIMENTS

Figure 1:
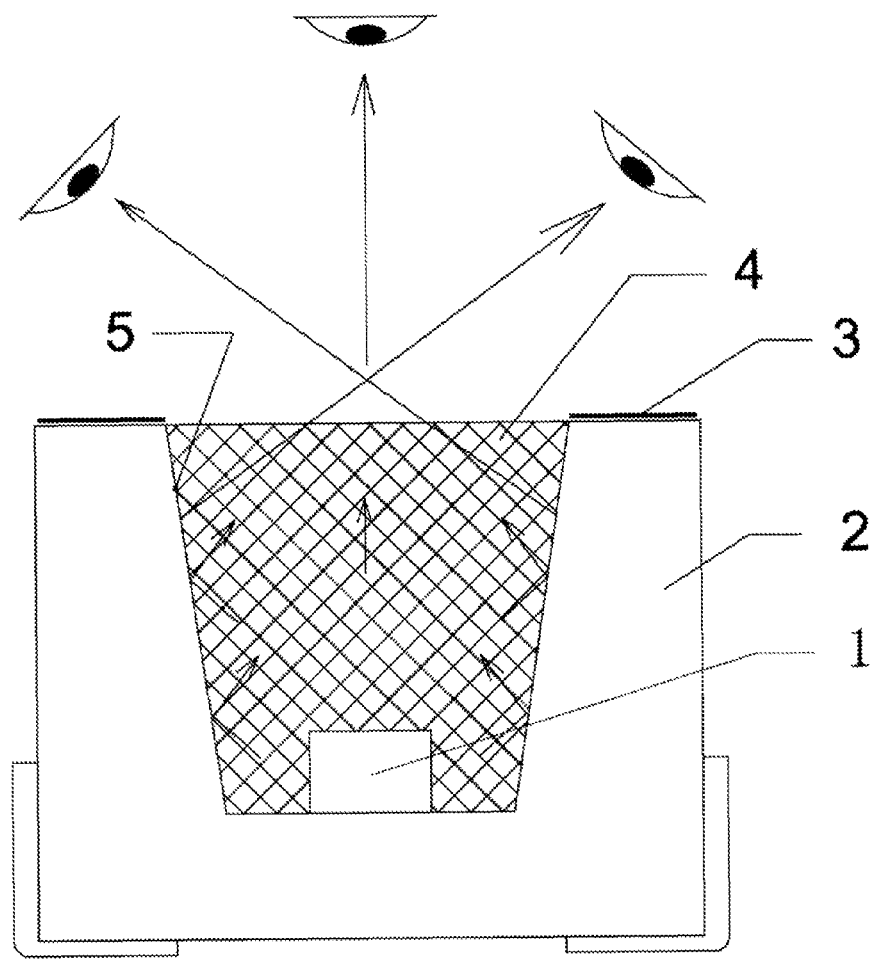
FIG. 1 is a sectional view of an LED lamp with "a white casing with screen-printed black face"
Figure 2:
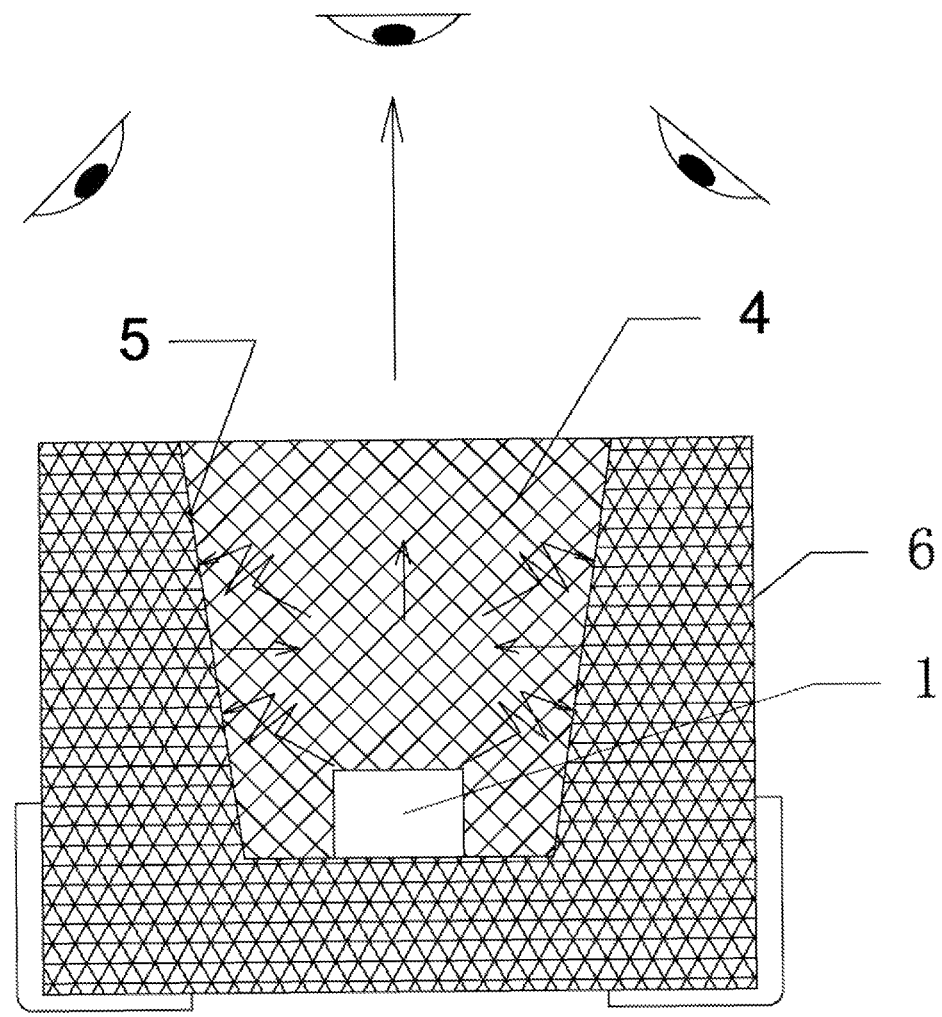
FIG. 2 is a sectional view of an LED lamp with an "all-black casing"
Figure 3:
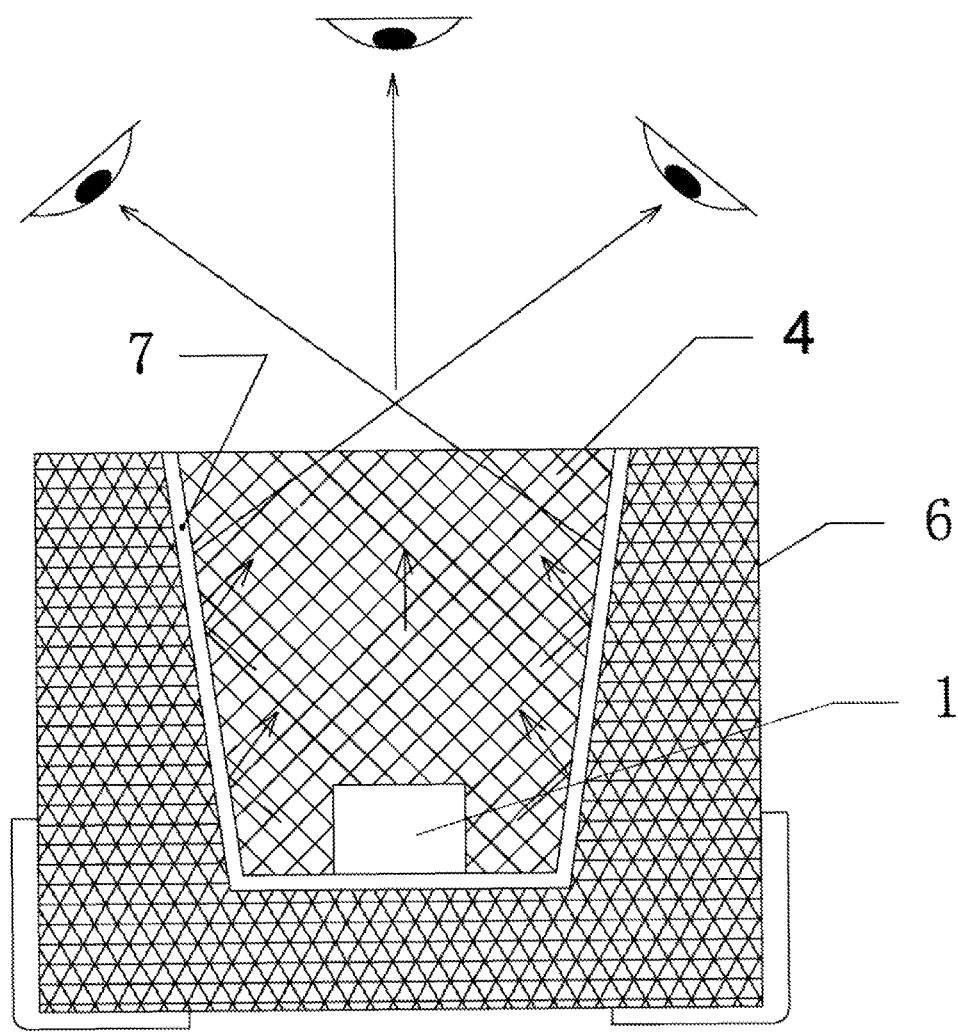
FIG. 3 is a sectional view of an LED lamp with an "outer-black and inner-white casing"
Figure 4:
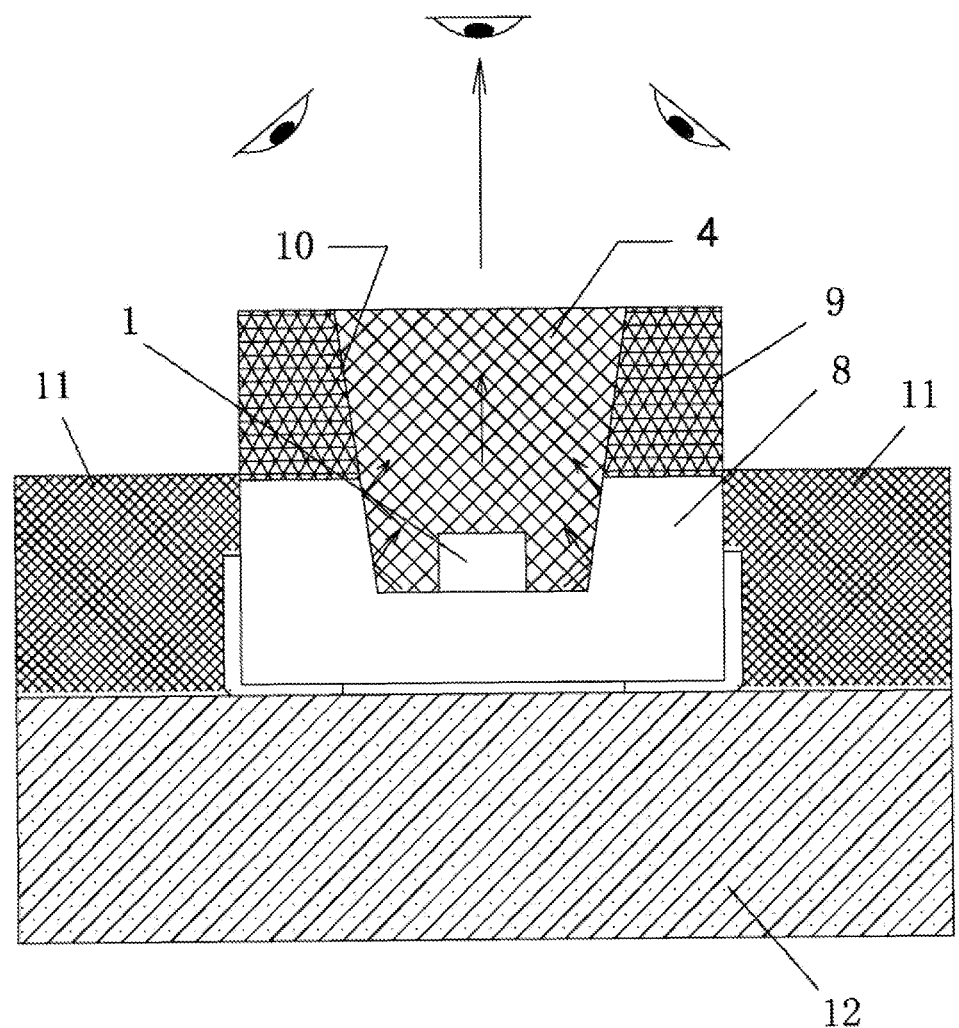
FIG. 4 is a sectional view of an LED lamp according to a candidate embodiment of the present invention.

As shown in FIG. 4, a high contrast water-proof LED lamp provided in the present invention includes: a plastic casing provided with a reflective cup 10, a PCB 12 disposed on the bottom surface of the casing, an LED chip 1 disposed inside the reflective cup 10, where the LED chip is electrically connected to the PCB. The reflective cup 10 is filled with a light-guiding packaging adhesive 4. The casing according to the present invention is formed by a composite of a light color layer 8 in the lower part and a dark color layer 9 in the upper part. A top surface of the PCB 12 and an outer surface of the light color layer 8 of the casing are provided with black water-proof adhesive sealant 11. In this embodiment, the light color layer 8 is a white layer, or a layer in other light colors, for example, a light yellow layer or a light gray layer. The dark color layer 9 is a black layer, or a layer in other dark colors, for example, a dark blue layer, a dark gray layer, or a dark coffee layer.

According to the present invention, with regard to the inner surface of the reflective cup, the lower part is a light color layer, and the upper part is a dark color layer. When the LED chip emits light, the bottom surface of the reflective cup and the surface of the light color layer in the lower part reflect the light. Ambient light can be only lead on the surface of the dark color layer in the upper part of the reflective cup (but the dark color layer does not reflect the light), but are hard to be lead to the surface of the light color layer in the lower part. In this way, the ambient light does not cause interference to luminance of the light emitted the LED chip, so that the contrast displayed by the product is enhanced. In addition, the black water-proof adhesive sealant makes a uniformly black appearance for the casing, so that the luminance of the light emitted by the LED chip is maintained optimal. Since a joint portion between the upper and lower parts of the casing, an exposed laminated line of the LED chip, and the bottom layer are all fully packaged by the water-proof adhesive sealant, the water-proof effect is ensured.

The above specific embodiments are only used to illustrate the structure disclosed in the present invention. Persons of ordinary skill in the art may derive various variations and modifications within the concept of the present invention, and such variations and modifications shall fall within the protection scope of the present invention.

What is claimed is:

1. A high contrast water-proof LED lamp, comprising a casing provided with a reflective cup (10), a printed circuit board (PCB) (12) disposed on a bottom surface of the casing, an LED chip (1) disposed inside the reflective cup (10), and a light-guiding packaging adhesive (4); wherein the casing is composed of a light color layer (8) in a lower part of the casing and a dark color layer (9) in an upper part of the casing, and a top surface of the PCB (12) and an outer surface of the light color layer (8) of the casing are provided with black water-proof adhesive sealant (11).

2. The high contrast water-proof LED lamp according to claim 1, wherein the light color layer (8) is a white layer, a light yellow layer, or a light gray layer.

3. The high contrast water-proof LED lamp according to claim 1, wherein the dark color layer (9) is a black layer, a dark blue layer, a dark gray layer, or a dark coffee layer.

* * * * *